United States Patent
Mintz et al.

(10) Patent No.: US 6,418,960 B1
(45) Date of Patent: Jul. 16, 2002

(54) ULTRASONIC ENHANCEMENT FOR SOLVENT PURGE OF A LIQUID DELIVERY SYSTEM

(75) Inventors: Donald M. Mintz, Sunnyvale; Ted G. Yoshidome, Oakland, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/415,101

(22) Filed: Oct. 6, 1999

(51) Int. Cl.$^7$ .............................. B08B 3/12; B08B 9/32; H04R 17/00
(52) U.S. Cl. ................ 137/242; 15/104.05; 134/169 C; 137/15.04; 137/15.05; 137/15.07; 137/240; 137/884; 310/322; 310/323.01; 310/328; 310/334; 366/127; 367/158; 367/162; 367/176; 422/128
(58) Field of Search .................. 15/104.03, 104.05, 15/104.07, 304; 134/166 C, 169 C, 169 R, 184 R; 137/238, 240, 242, 15.04, 15.05, 15.07, 884; 310/328, 322, 323.01, 334; 366/114, 127; 422/128; 367/158, 162, 176; 376/189

(56) References Cited

U.S. PATENT DOCUMENTS

| | | | | |
|---|---|---|---|---|
| 3,175,567 A | * | 3/1965 | Crawford ................. | 134/169 C |
| 4,869,301 A | * | 9/1989 | Ohmi et al. .................... | 141/85 |
| 4,917,136 A | * | 4/1990 | Ohmi et al. ................. | 137/240 |
| 5,241,987 A | * | 9/1993 | Ohmi et al. ................. | 137/597 |
| 5,313,982 A | * | 5/1994 | Ohmi et al. ................. | 137/597 |
| 5,368,062 A | * | 11/1994 | Okumura et al. ........... | 137/240 |
| 5,395,592 A | * | 3/1995 | Bolleman et al. ........... | 422/128 |
| 5,417,236 A | * | 5/1995 | Moore et al. ................. | 137/238 |
| 5,497,316 A | * | 3/1996 | Sierk et al. .................... | 700/11 |
| 5,605,179 A | * | 2/1997 | Strong, Jr. et al. .......... | 137/884 |
| 5,748,566 A | | 5/1998 | Goodson ..................... | 367/158 |
| 5,749,389 A | * | 5/1998 | Ritrosi et al. ............... | 137/240 |
| 5,819,782 A | * | 10/1998 | Itafuji ......................... | 137/240 |

FOREIGN PATENT DOCUMENTS

| | | | | |
|---|---|---|---|---|
| FR | 2330284 | * | 5/1997 | ................. 137/242 |

* cited by examiner

Primary Examiner—George L. Walton
(74) Attorney, Agent, or Firm—Moser, Patterson & Sheridan (57) ABSTRACT

The present invention generally provides an apparatus and method for improving the process of purging a liquid delivery system used in integrated circuit manufacturing. The liquid delivery system comprises ultrasonic transducers mounted to various components of a liquid delivery system. The transducers may be mounted on housings, isolation valves, fuel injectors, pump assemblies, fluid lines, and/or liquid flow meters. The ultrasonic transducers launch ultrasonic energy that enhance the removal of processing liquids and particulate material from components of the system. The present invention provides for a purge process where a purge fluid, preferably a liquid solvent, is flowed into the liquid delivery system and ultrasonic energy is launched into the purge fluid to enhance dissolution of residual processing liquids and particulate matter in the liquid delivery system, including from cracks and crevices in valves and other complex mechanical devices before being pumped from the liquid delivery system.

55 Claims, 5 Drawing Sheets

ULTRASONIC ENHANCEMENT FOR SOLVENT PURGE OF A LIQUID DELIVERY SYSTEM

FIELD OF THE INVENTION

The present invention relates to liquid delivery systems for processing chambers. More particularly, the invention relates to an apparatus and method for purging a processing liquid from a liquid delivery system using ultrasonic energy.

BACKGROUND OF THE RELATED ART

Many semiconductor processes such as chemical vapor deposition (CVD) employ liquid delivery systems to supply reactive precursors to chambers for processing. Liquids are typically vaporized and supplied to a processing chamber via a liquid delivery system comprising an interconnecting network of pipes, isolation valves, flow regulators and vaporizing mechanisms. Over time, the components of the liquid delivery system may require replacement due to mechanical failure or require cleaning due to deposit formation within the liquid delivery system. However, replacing a component of the liquid delivery system such as a vaporizing mechanism is a complicated and slow process. Additionally, many processing liquids, such as metal organic precursors for CVD processes, are difficult to remove from the surfaces of the lines and the cracks and crevices formed by the mechanical components of the liquid delivery system. These difficult to remove processing fluids may remain as liquid residue during the process of replacing components.

During system maintenance including component replacement process, the liquid residue in the liquid delivery system and/or components therein may react with oxygen and moisture in the ambient air to form undesirable by-products. These by-products are often solid films such as oxides that may damage the liquid delivery system or may pose a particle problem during subsequent deposition processes. When oxide particles contaminate a deposition process, the subsequently formed films may peel from the adjacent layers or substrate, and if the contamination is severe enough, may render the substrate unusable.

To prevent contaminants from forming during the replacement of components in the liquid delivery system, the processing liquid is purged from all processing liquid paths that will be exposed to the atmosphere when the component is removed. Typically, an inert purge gas, such as nitrogen, is used to remove the undesirable residual processing liquid. However, purge gases are only moderately effective at removing most residual processing liquids and are even less effective at removing particulate matter lodged within the components of the system. The gas purge process is typically ineffective for removing processing liquids that readily adhere to the components and lines of the liquid delivery system and often requires a substantial volume of purge gas to completely sweep out the residual processing liquid.

One approach to improving the effectiveness of the purge process is to employ a "flushing liquid" to reduce the retention of the processing liquids in the liquid delivery system. Flushing or purge liquids are often solvents for the processing liquids. For instance, one example of a metal organic precursor used as a processing liquid in chemical vapor deposition is tetrakis(dimethylamino)titanium (TDMAT). TDMAT is typically used in the deposition of titanium nitride (TiN) layers. A flushing or purge liquid of hexane, a solvent of TDMAT, is typically used to purge TDMAT from a liquid delivery system. Unfortunately, if a processing liquid is particularly difficult to remove, such as TDMAT, the flushing solvent process may still be ineffective at removing all of the residual processing liquid and particulate matter from cracks and crevices formed by the mechanical components of the line. Like the purge gas, the flushing liquid solvent process typically requires a substantial volume of purge liquid to completely sweep out the processing liquid.

One hardware solution to minimize processing liquid contamination during liquid delivery system component removal is to limit the amount of the system exposed to potential contamination. The hardware solution provides for an isolation valve assembly composed of at least two isolation valves, a pump valve, and a purge fluid valve configured to reduce the exposed line defined by the valves. In the assembly, the two or more isolation valves are closed to isolate the region containing the line and/or corresponding component from the system. Typically, isolated components are those sensitive to contamination or require frequent replacement.

Coupled to the isolated region are a purge valve and a pump valve. The purge valve opens to allow a purge fluid to enter the isolated region and the pump valve is opened to evacuate the residual processing liquid and purge fluid from the isolated region. Once purging is complete, the purge and pump valves are closed and the component may be removed. The valve arrangement allows the isolated component of the system, such as a dysfunctional injection valve, to be more efficiently purged with less purging fluid. However, these systems simply limit particle contamination to smaller portions of the line, and still may not effectively purge processing liquids from the line nor improve the removal of particulate matter from the cracks and crevices of the devices of the liquid delivery system.

Accordingly, there exists a need for a processing liquid purging method and apparatus that more effectively purges processing liquids and contaminates from a processing liquid delivery system without requiring additional expense and complexity associated with the use of processing liquids or purging fluids.

SUMMARY OF THE INVENTION

The present invention generally provides an apparatus and method for purging a liquid delivery system used in integrated circuit manufacturing. More particularly, the invention provides a liquid delivery system comprising one or more liquid delivery components defining a processing liquid path, and at least one ultrasonic transducer mounted on the one or more liquid delivery components. A purge fluid, preferably a solvent, is flowed through the liquid delivery system and the ultrasonic transducers launch energy into the purge fluid to improve the purge process.

In one embodiment, the invention provides a liquid delivery system comprising one or more liquid delivery components defining a processing liquid path and an ultrasonic transducer mounted on one or more liquid delivery components. The components of the liquid delivery system may include one or more liquid flow meters, one or more isolation valves, one or more vaporizing elements, one or more fluid lines, and combinations thereof. Further, one or more liquid delivery components may comprise one or more housings with at least one ultrasonic transducer mounted on the one or more housings. In another aspect, one or more liquid delivery components may comprise a gas box comprising a liquid source assembly, a fluid purge assembly, and an isolation valve assembly, and have at least one ultrasonic transducer mounted on the gas box. The liquid delivery system may further comprise a heater in thermal communication with the processing liquid path.

In another aspect, the invention provides a liquid delivery system comprising a plurality of housings, or enclosures, and assemblies disposed along and forming a part of a processing liquid path, which includes a gas box, a direct liquid introduction enclosure coupled to the gas box, a pump valve assembly operatively coupled to the liquid introduction enclosure, and at least one ultrasonic transducer mounted on the gas box, the direct liquid introduction enclosure, the pump valve assembly, or a combination thereof. The liquid delivery system may further comprise a heater in thermal communication with the processing liquid path.

In another aspect, the invention provides a method of purging a liquid delivery system by introducing a purging fluid into the liquid delivery system, launching ultrasonic energy into the purging fluid within the liquid delivery system, and pumping the processing liquid and the purging fluid from the liquid delivery system. These steps may repeated until the liquid delivery system is sufficiently purged of processing liquid. The system may be flushed to remove all residual processing liquid following the purging and pumping steps. The purging and flushing fluid may be a liquid, a gas, or a combinations thereof, but is typically a liquid solvent of the processing liquid. To further improve the removal of contaminants, heat may be applied to the system at a temperature from about 70° C. to about 800° C. during the purge process to improve the dissolution of contaminants into the purge fluid.

BRIEF DESCRIPTION OF THE DRAWINGS

So that the manner in which the above recited features, advantages and objects of the present invention are attained and may be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
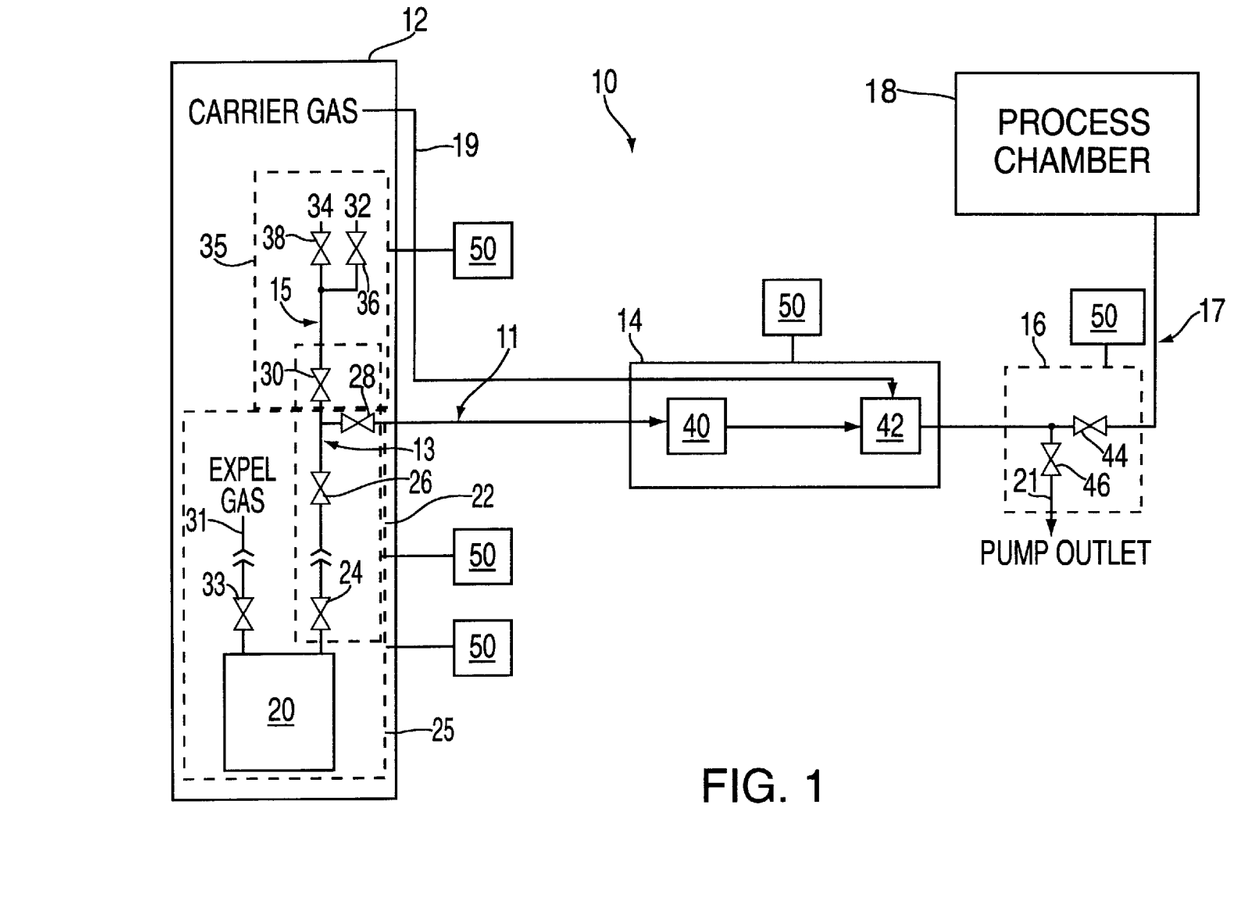
FIG. 1 is a schematic diagram of one embodiment of a liquid delivery system in accordance with the present invention.

FIG. 1 is a schematic diagram of a representative liquid delivery system 10 used to provide a vaporized precursor to a processing chamber 18. Other liquid delivery systems could be used to advantage with the invention and are within the scope of the invention. The liquid delivery system 10 may include a gas box 12, a direct liquid introduction enclosure 14, an isolation pump valve assembly 16, and a processing chamber 18, disposed along and forming part of the processing liquid path 11 of the liquid delivery system 10. At least one, but preferably a plurality of ultrasonic transducers 50, are mounted on one or more of the liquid delivery system components including the gas box 12, the direct liquid introduction enclosure 14, and/or on the isolation pump valve assembly 16.

A gas box 12 typically includes a carrier gas line 19, an isolation valve assembly 22, a liquid source assembly 25, and a fluid purging assembly 35. The liquid source assembly 25 controls the delivery of a precursor or processing liquid 20 from a container to the processing liquid path 11. The precursor liquid is displaced from the container of a processing liquid 20 and introduced into the processing liquid path 11 by a pressurized expelling gas provided by an expelling gas source 31 operatively coupled to the container of precursor liquid 20 by an isolation valve 33. The displaced precursor liquid flows through a processing liquid flow line 13 of the processing liquid path 11 and enters an isolation valve assembly 22.

The isolation valve assembly 22 includes a first isolation valve 24, a second isolation valve 26, and a third isolation valve 28, disposed along the liquid flow line 13 between the liquid source assembly 25 and the direct liquid introduction enclosure 14. The first isolation valve 24, located near the introduction of the processing liquid 20 into the processing liquid path 11, isolates the container of the processing fluid 20 from the processing flow line 13 of the processing liquid path 11. The second isolation valve 26 is disposed between the first isolation valve and a 3-way section of the piping formed by the introduction of a purge fluid line 15 to the processing liquid flow line 13. The second isolation valve 26 isolates the container of the processing liquid 20 from the purge fluid line 15. The third isolation valve 28 is disposed between the liquid flow meter 40 of the direct liquid introduction enclosure 14 and the 3-way section of the processing liquid path 11. The third isolation valve 28 of the valve assembly 22 isolates the direct liquid introduction enclosure 14 from the processing liquid flow line 13 and the purge fluid line 15.

Coupled to the processing liquid flow line 13 is a fluid purging assembly 35. The fluid purge assembly 35 includes a purging fluid line 15, an isolation purge valve 30, a source of gas purge 32, a source of liquid purge 34, a gas purge valve 36, and a liquid purge valve 38. The purge fluid line 15 is operatively coupled to the processing liquid flow line 13 and a purge fluid by the isolation purge valve 30. Disposed along and forming part of the purging fluid line 15 is an isolation valve 36 separating the gas purge source 32 from the processing liquid flow line 13. The purging fluid may be an inert gas such as nitrogen, argon, or some other gas which does not react with the processing liquid. Additionally, the purging fluid may also be a liquid, preferably a liquid solvent of the precursor processing fluid, such as hexane for a TDMAT precursor. An isolation valve 38 separating the liquid purge source 34 from the processing liquid flow line 13 is disposed along and forms part of the purging fluid line 15.

The gas box 12 further includes a carrier gas line 19 coupled with the injection valve 42 of the direct liquid introduction enclosure 14. The carrier gas is usually an inert gas or other gas that will not chemically react with the processing fluid produced from the liquid source assembly 25. Typically, the carrier gas is helium (He) or nitrogen ($N_2$). The carrier gas may share the same fluid source as the purge gas of the fluid purge assembly 35.

The direct liquid introduction enclosure 14 includes a liquid flow meter 40 coupled to an injection valve 42. A liquid flow meter 40 is disposed between the injection valve 42 and an isolation valve, such as isolation valve 28. The flow meter 40 measures the processing liquid flow rate from the processing liquid flow line 13 prior to entering the injection valve 42. The injection valve 42 comprises a fluid inlet for receiving a pressurized processing liquid from the processing liquid flow line 13, a carrier gas inlet for receiving a carrier gas line 19, and an outlet line 17 for delivering a vaporized processing liquid/carrier gas mixture to a processing chamber 18. In operation, the carrier gas enters the injection valve 42, wherein the precursor liquid from the processing liquid flow line 13 is injected into the carrier gas. The vaporized liquid precursor/carrier gases leave the injection valve 42 by the process chamber feed line 17 for reaction in the process chamber 18 via the pump valve assembly 16. The injection valve is often heated so that when the processing liquid is injected into the carrier gas, the heat and the low partial vapor pressure of the processing liquid in the carrier gas causes the processing liquid to vaporize.

The pump valve assembly 16 provides isolation of the direct liquid introduction enclosure 14 from the process chamber 18 and removal of processing and purge fluid from the liquid delivery system. The pump valve assembly comprises an isolation valve 44 disposed between the processing chamber 18 and the direct liquid introduction enclosure 14 along the process chamber feed line 17, and an isolation pump valve 46 disposed between the process chamber feed line 17 and the purge pump (not shown). The isolation pump valve 44 isolates a section of the processing liquid path 11 for removal of processing and purge fluids.

Fluid in isolated sections of the liquid path in communication with the isolation pump valve 44 may be pumped out through the isolation pump valve 46. Typically, the isolation pump valve 46 remains closed, but during a purge cycle the pump valve 46 opens to allow a pump (not shown) to remove the purge fluid and residual processing liquid by way of the pump outlet line 21. The pump outlet line 21, leads to a bum box (not shown) or waste bottle (not shown) for disposal of the fluids pumped from the lines. If components such as the liquid flow meter 40 and/or the injection valve 42 are to be removed or replace in the system 10, both isolation valves 44 and 46 will be closed, after any pre-dissembling processes such as a purge process has occurred. Typically, a large number of other isolation valves may be used in a multitude of desired configurations in the pump valve assembly 16, but are omitted for clarity.

In one embodiment, the liquid delivery system 10 is connected to a process chamber 18 via the processing chamber feed line 17. Preferably, the process chamber 18 is a chemical vapor deposition chamber. Typically, the CVD process chamber 18 is a metal organic CVD chamber such as a $T_xZ$™ chamber commercially available from Applied Materials, Inc., located in Santa Clara, Calif.

Ultrasonic transducers 50 are mounted on the liquid delivery system 10 to enhance the purging of processing liquids and contaminants during the purging process of the present invention. The introduction of using ultrasonic energy during a purge process in a liquid delivery system is believed to provide more rapid dissolution of metal organic precursor processing liquid into the purge liquid, typically a solvent of the precursor, and to dislodge particulate matter from within the components of the system. The ultrasonic energy launched by the transducers during the purge process will result in a more efficient use of the purge fluids during the purge flush.

Transducers 50 may be mounted on any component of the liquid delivery system 10, but are typically applied to the mechanical components of the liquid delivery system 10, such as isolation valves, injection valves and flow meters. Preferably, for use in purge processes, the transducers 50 are mounted on devices sensitive to particulate matter and contamination requiring frequent replacement or cleaning. Since the ultrasonic transducers are mounted on components that are mechanically coupled to other components in the system, the transducers may be mounted in proximity to a component in order to launch the ultrasonic energy into the desired component.

Further, many of the components of the liquid delivery system, such as the liquid flow meter 40 and the injection valve 42, are placed in housings or enclosures, for example, the direct liquid introduction enclosure 14. The transducers may be applied to the housings, and are typically mounted on the sides and bottom of the housing to launch ultrasonic energy throughout the housing. In such an application, the transducers launch ultrasonic energy not only to the devices of the housing, but also to any processing liquid feed lines located within the housings, thereby helping to remove residual processing liquid from the liquid delivery system. Since the ultrasonic transducers are mounted on components that are mechanically coupled to other components in the system, the transducers may be mounted in proximity to a component in order to launch the ultrasonic energy into the desired component. One ultrasonic transducer used to advantage is the Vibra-bar XG-250-3 transducer and is available from Crest Ultrasonics Corp., located in Trenton, N.J.

FIG. 1 further illustrates the use of the transducers mounted on direct liquid introduction enclosure 14, the isolation valve assembly 22, the pump valve assembly 16, and individual devices and assemblies of the gas box 12. In the gas box 12, an ultrasonic transducer 50 can be coupled with the isolation valve assembly 22 to launch ultrasonic energy to assist in removing processing fluid from the assembly 22, or alternatively, the ultrasonic transducer 50 may be mounted upon one or all of the isolation valves 24, 26, and 28 of the assembly 22. An ultrasonic transducer 50 may be coupled with the liquid source assembly 25 or the fluid purging assembly 35, or alternatively, the ultrasonic transducer 50 may be mounted on one or all of the isolation valves 30, 33, 36, and 38. An ultrasonic transducer 50 can be mounted on the direct liquid introduction enclosure 14 to launch ultrasonic energy to desorb processing liquid and contaminants, but may be mounted directly on the flow meter 40 and/or injection valve 42. Further, ultrasonic transducers 50 may be coupled with the isolating pump assembly 16 or one of the valves of the assembly to remove residual material during the pumping stage of the purging process.

Figure 3:
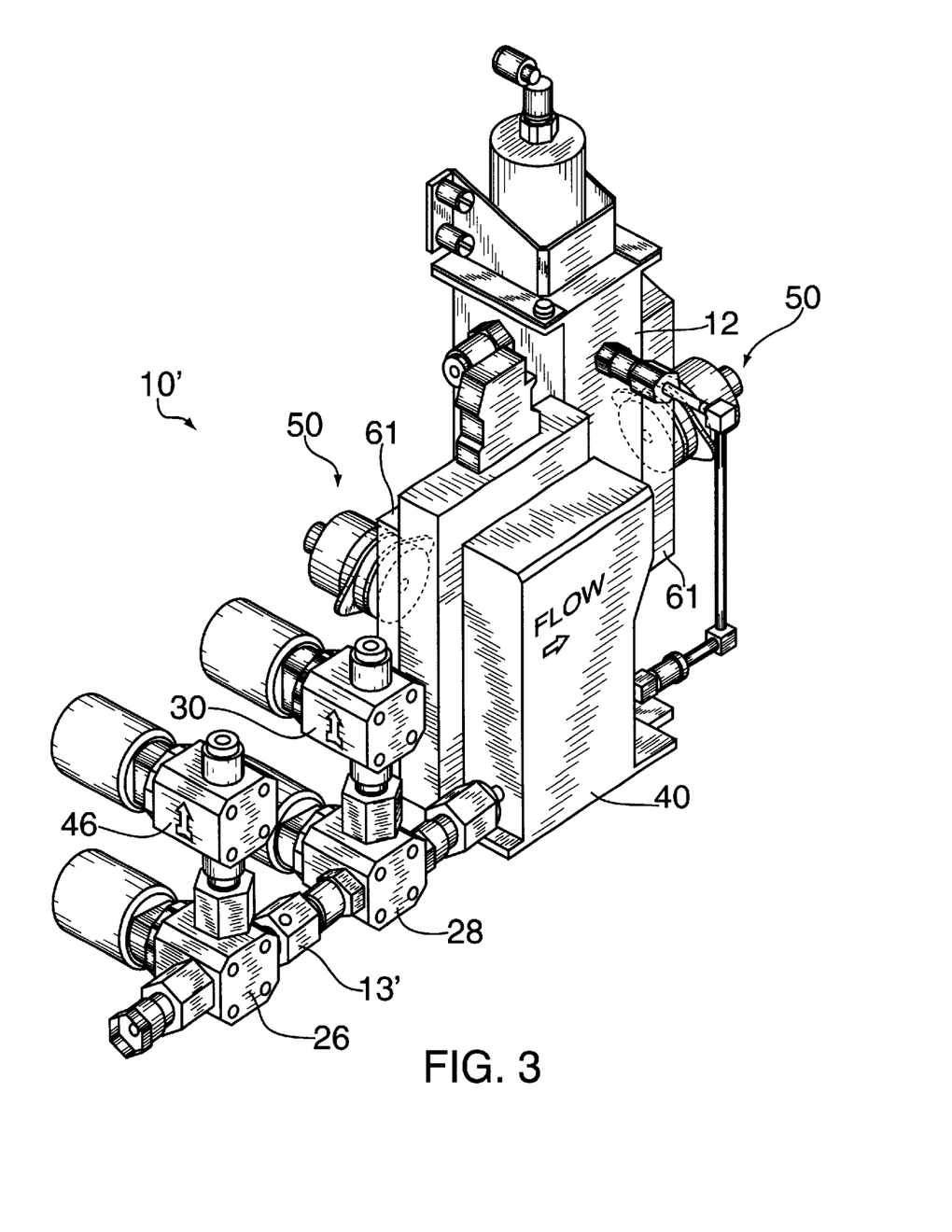
FIG. 3 is a perspective view of a portion of a liquid delivery system showing an ultrasonic transducer mounted on a liquid delivery system.

FIG. 3 illustrates an ultrasonic transducer 50 attached to the side of a flow meter 40 and an injection valve 42. Isolation valves 26, 28, 30, pump valve 46, and the pump valve assembly 16 are configured so that the processing liquid flow line 13' is minimized to allow purging of processing fluids before removal of the liquid flow meter 40 and/or an injection valve 42. The transducer is preferably mounted on the liquid flow meter 40 or an injection valve 42, and more preferably on the back or on the bottom (not shown) of the liquid flow meter 40 and/or injection valve 42 as shown in FIG. 3. A person skilled in the art will appreciate that ultrasonic transducers may be used in liquid delivery systems with different configurations and structures for placement of transducers. For example, FIG. 3 shows a transducer attached to a injection valve 42 rather than the direct liquid introduction enclosure 14 of FIG. 1.

Figure 4:
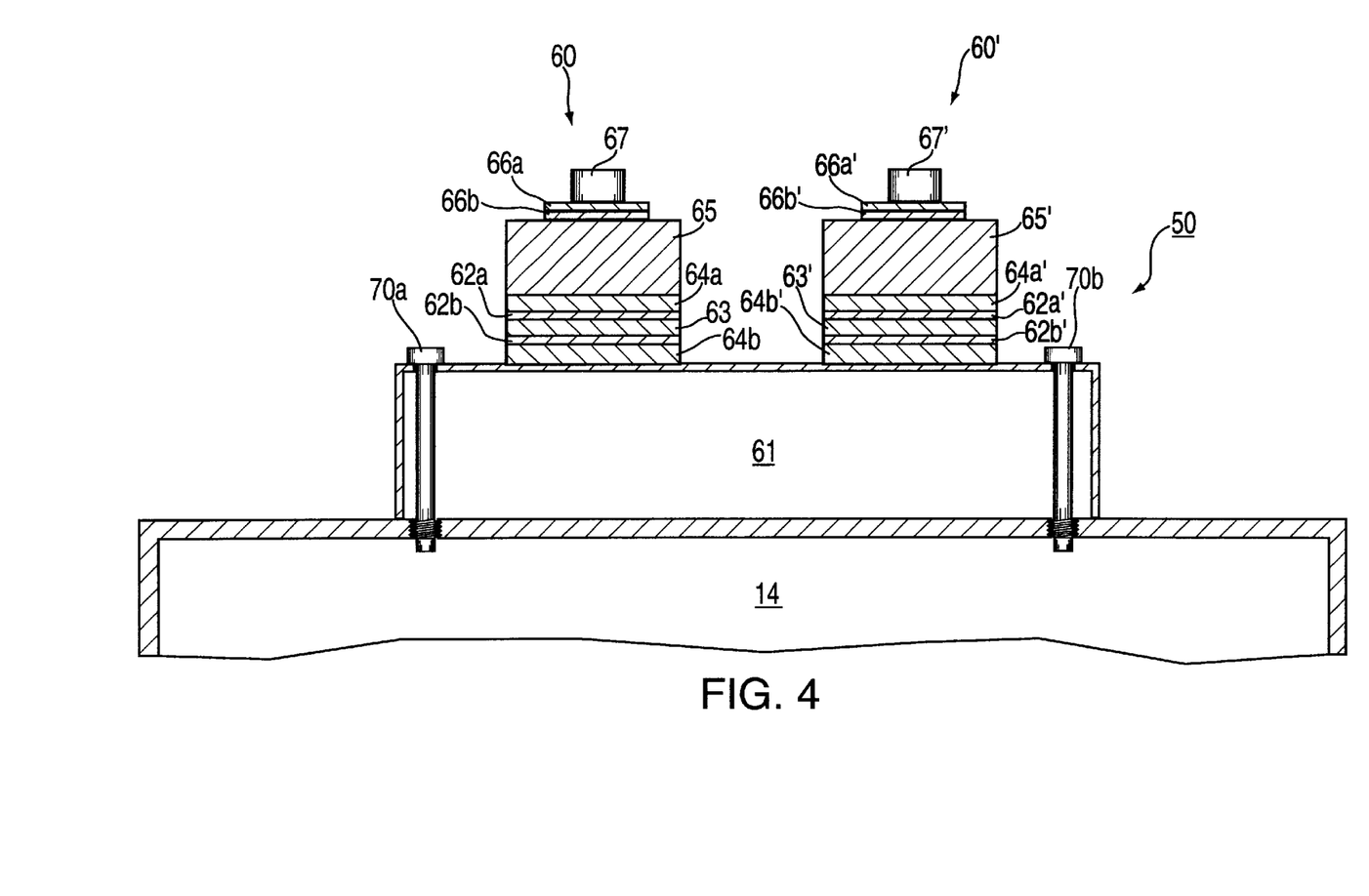
FIG. 4 is a cross-sectional view of an ultrasonic transducer mounted to a housing of a liquid delivery system.

FIG. 4 illustrates ultrasonic transducer 50 with two transducer stacks 60 and 60' mounted on a single transducer base 61 that is affixed to the direct liquid introduction enclosure 14 by threaded fasteners 70a, 70b. The two fasteners 70a, 70b, are shown for illustrative purposes, but any number of threaded fasteners may be used to ensure a proper mounting of the transducer 50. Alternatively, the transducer base 61 may also be affixed to the direct liquid introduction enclosure 14 by the use of an adhesive (not shown) or by welding (not shown). The adhesive is preferably a high temperature adhesive able to hold the transducer base 61 to the direct liquid introduction enclosure 14 under high temperature processing conditions as well as cooler conditions when the system 10 is not in use. The adhesive is preferably applied between the transducer base 61 and the direct liquid introduction enclosure 14 in a sufficient amount to ensure a solid adhesive seal between the components without the need of frequent reapplication of the adhesive or replacement of the ultrasonic transducer 50. Both the threaded fasteners 70a, 70b, and the adhesive may be used together to ensure a proper mount of the transducer base 61. Additionally, a more permanent means for affixing the transducer 50 to the component may be used, e.g., welding or brazing techniques may be used to permanently attach the transducer 50 or transducer base 61 to a component housing.

The transducer base 61 is rectangular in shape, but may be cylindrical or of any other suitable shape having a flat surface to provide an effective mounting surface on any component of the liquid delivery system 10. Furthermore, while FIG. 4 shows the transducer base 61 and transducer stacks 60 and 60' mounted on the direct liquid introduction enclosure 14, the transducer 50 may be mounted on any assembly or any housing (or enclosure) of the liquid delivery system 10, or on any component of the system 10, such as an isolation valve, having a flat surface for mounting. For example, transducer stack 60 and/or 60' on the transducer base 61 may be attached to any of the flat surfaces of the isolation valves 26, 28, 30, and 46 of the liquid delivery system 10' shown in FIG. 3.

Figure 5:
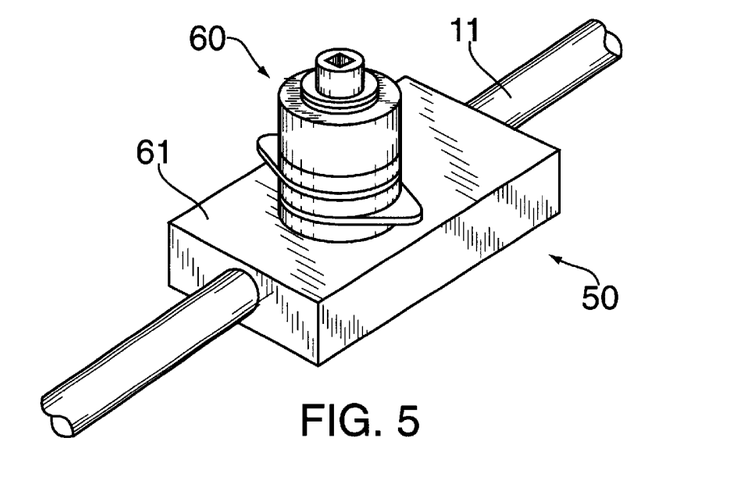
FIG. 5 is a perspective view of an ultrasonic transducer mounted on a fluid line of the liquid delivery system.

FIG. 5 illustrates an ultrasonic transducer mounted on a fluid line of the present invention. The transducer stack 60 is mounted on a transducer base 61 having an opening formed therein through which a portion of the liquid flow path 11 is disposed. Single or multiple lines may pass through the base of the transducer. The transducer base is shown having a rectangular shape, but may have any configuration desired to mount the transducer 50 on the liquid flow path 11. Mounting the transducers 50 on portions of the liquid flow path 11 allows the lines between valves, and the valves themselves, to receive ultrasonic energy. Preferably, the transducers are mounted on lines next to valves, such as the third isolation valve 28, in FIGS. 1 and 6 are always open during processing liquid flow and purge liquid flow.

Figure 6:
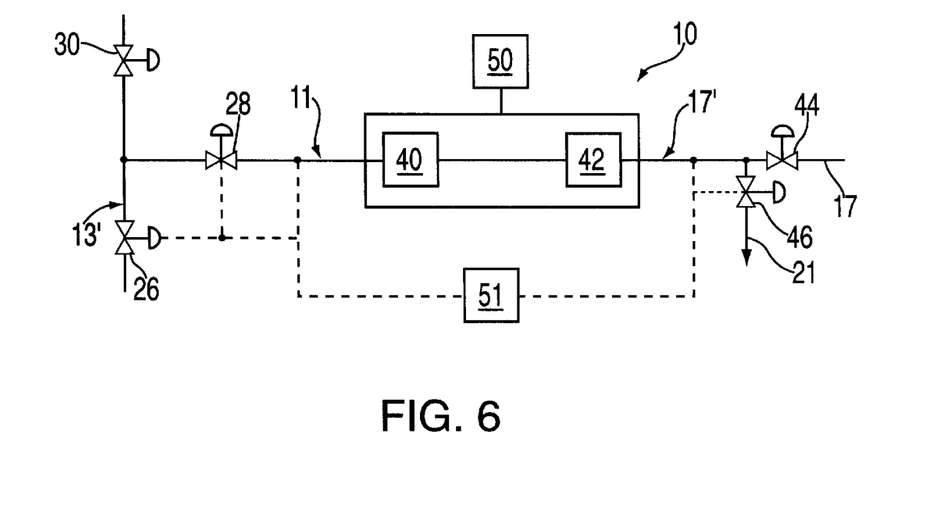
FIG. 6 is a schematic diagram of a portion of a liquid delivery system illustrating a heater.

FIG. 6 illustrates an alternative embodiment of the present invention, wherein a heater 51 is coupled to the liquid delivery system 10 to provide heating to the system during the purge process. The heater is preferably mounted in proximity to those areas and components susceptible to contamination such as isolation valves. To further improve processing liquid purge from the liquid delivery system 10, the second isolation valve 26, the third isolation valve 28, the pump valve 46, a small portion 13' processing liquid flow line 13, and a small portion 17' of the processing chamber feed line 17 can be heated to a temperature from about 70° C. to about 800° C. during the purge process. The heater 51 may include a heat trace, heater rods, flexible silicon rubber heaters, custom form fitting heaters or other equivalent embodiments that may provide heating to the liquid delivery system 10.

Heating one or more of the above-listed components provides additional energy for desorption of processing liquid from the various surfaces within the liquid delivery system 10, which, in conjunction with the pump/purge cycles described below, results in highly effective processing liquid purging. A heated purge gas may be similarly employed to heat the processing liquid if desired.

Ultrasonic Transducers

Figure 2:
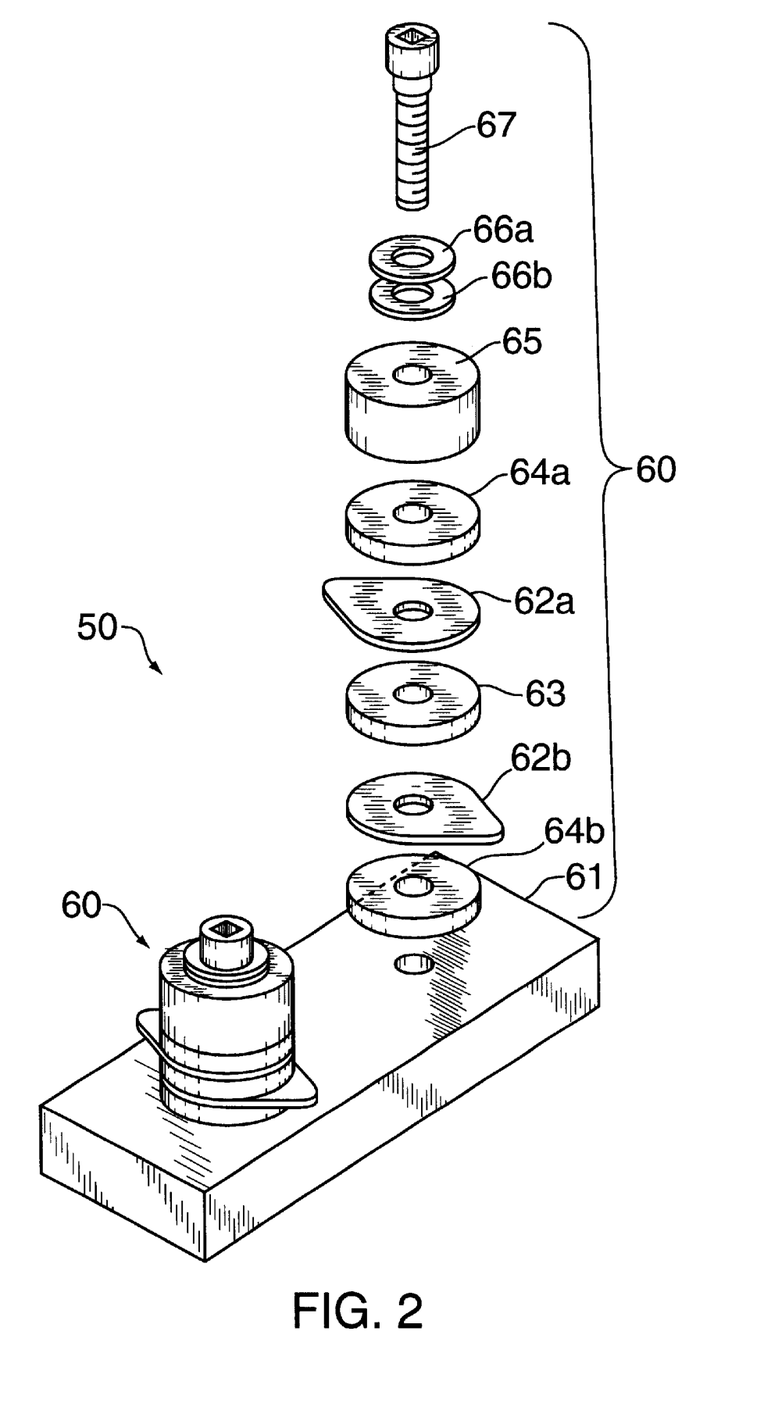
FIG. 2 is an exploded view of an ultrasonic transducer.

FIG. 2 illustrates the components of a typical ultrasonic transducer 50. An ultrasonic transducer or transducer stack 60 comprises a base 61, a pair of electrodes 62a, 62b, a Piezo electric crystal 63, insulators 64a, 64b, a clamping mass 65, washers 66a, 66b, and a bolt 67. Starting from the bottom of the structure in FIG. 2, the base 61, which is made of a suitable material which can be securely clamped to the rest of the transducer stack 60. Typically, the material is a metal such as aluminum which is capable of being bonded to or mechanically clamped to a container which holds a liquid. The base 61 may be of any suitable shape, an example of a rectangular base is shown in FIG. 2. The base 61 may be designed to comprise one or more transducer stacks 60. The next component is a dielectric insulator 64b, and then followed by a Piezo electric crystal 63. Typically, two metal electrodes 62a, 62b are coupled to the Piezo electric crystal 63. The crystal 63 is typically made of lead zirconate titanate, and is preferably 0.50–4.00 inches in diameter, and 0.10–0.50 inches thick. On the opposite side of the crystal is another dielectric insulator 64a. On the opposite side, adjacent to the insulator 64a is a metal clamping mass 65 which is typically cylindrical in shape, and made of steel or plated steel. Lastly, the apparatus is provided with washers 66a, 66b, and a bolt 67. All of the above listed components are assembled and coupled to the base 61 and one another by tightening the bolt 67 to a preferable torque pressure of 150–400 inch-pounds. Optimally, that pressure is between 200–300 inch-pounds.

Transducers 50 may be comprised of multiple transducer stacks, but typically only two transducer stacks 60 are used as shown in FIG. 2. When configured with multiple transducer stacks, the stacks 60 may each have a different frequency, allowing the transducer to emit simultaneous multiple frequencies during use. Preferred frequencies for the transducer stacks are selected from the range of 25 kHz to 200 kHz. When mounted to components of a system, transducers are secured to the component by means of a fastener such as a screw; or alternatively secured by an adhesive, preferably a high temperature adhesive to remain secured during the high process temperatures of semiconductor manufacturing.

The Process

During typical operation of the liquid delivery system 10, the first isolation valve 24, the second isolation valve 26 and the third isolation valve 28 are open to allow processing liquid to flow from the source of processing liquid 20 to the injection valve 42 at a rate controlled by the liquid flow meter 40. Expel gas 31 applied through open valve 33 provides the force to move the processing liquid from the source of the processing liquid 20 into the processing liquid path 11 and ultimately the injection valve 42.

A carrier gas line 19 enters the injection valve 42, wherein the processing fluid is injected into the carrier gas and the combined processing liquid/carrier gas then flows to the processing chamber 19 via the process chamber feed line 17 and the pump valve assembly 16. The purge valve 30 and the pump valve 46 are closed to prevent processing liquid from being exposed to the purging fluid and from leaving the liquid delivery system by the pump outlet line 21. Any other relevant but not depicted isolation valves or devices of the system 10 are similarity disposed to only allow flow along the processing liquid path 11 from the gas box 12 to the process chamber 18.

A method of purging a processing liquid from the representative liquid delivery system 10 of FIG. 1 begins with the isolation of the portion of the liquid delivery system to be purged. In general, for a purge process, the component to be removed or line to be purged will be isolated by using isolation valves to change the liquid flow from a source of processing liquid 20 to a destination, such as a processing chamber 18, to a liquid flow from a purge source 32, 34 to an purge fluid outlet 21. The isolation valves therefore protect equipment such as the processing chamber 18 from the purge fluid while allowing purging and safe removal of the desired components.

If, for example, the injection valve 42 is to be replaced, the injection valve 42 is isolated from the source of processing liquid 20 by closing the first isolation valve 24, and typically the second isolation valve 26, to prevent processing fluid from entering the isolated portion of the liquid delivery line. The pump isolation valve 44 likewise closes to prevent flow of processing liquid and purge fluid from entering the process chamber 18.

A purging fluid is introduced by opening the purge valve 30 disposed on the purge line 15. Depending on the nature of the purging fluid, the liquid purging valve 38, the gas purging valve 36, or a combination of both are opened to allow a purging fluid to enter the system 10. Preferably, the purge is a gas expulsion of the processing liquid by a purge gas from the purge gas source 32 via purge valves 30 and 36, then a vacuum pumping through isolation valve 46, and finally an introduction of a purge liquid from the purge liquid source 34 via valves 30 and 38. The purging fluid dislodges absorbed processing liquid molecules from the surfaces of the system 10, and the dislodged particles are pumped from the system 10 via the pump and pump valve 46.

While a purge liquid is flowing in the isolated liquid delivery line, ultrasonic energy is launched into the liquid delivery system and fluids therein by the use of ultrasonic transducers mounted on the system. Preferably, the ultrasonic energy is launched after the purging fluid and processing liquid have had a chance to mix so that the processing liquid dissolves into the solvent purge fluid. The ultrasonic energy is believed to improve mixing of the heterogeneous processing fluids in the solvent and therefore improves desorption of the processing liquid from the system 10. It is also believed that ultrasonic energy improves dispersal of particulates and processing fluids from the cracks and crevices in the devices of the system 10 and into the purge fluid. To further improve the purge process, the liquid delivery system may be heated by a heater 51. Heating is believed to provide additional energy for desorption of processing liquid from the various surfaces within the liquid delivery system 10 into the solvent purge fluid and therefore result in a highly effective liquid purge process.

Typically, the ultrasonic energy is launched at about 10 to about 250 Watts, but preferably at about 10 to about 100 Watts on each of a plurality of transducers 50. The ultrasonic energy will also have a frequency of about 25 kHz to about 200 kHz, preferably greater than about 40 kHz since this is out of the audible range and contains fewer disruptive harmonics. If one or more transducers stacks 60 are contained per ultrasonic transducer, then the stacks may have simultaneous multiple frequencies. The ultrasonic energy is preferably launched for about 3 to about 60 seconds, but longer time periods may be used depending upon the application. Ultrasonic energy produced by the transducers 50 can be activated as necessary, sequentially or simultaneously, for the duration necessary to achieve the desired purge results. The system can be heated to a temperature from about 70° C. to about 800° C. via the heater 51 during processing liquid purging to further improve the results of the purge process.

After, or even during, the application of ultrasonic energy, the purge valve 30 and purge fluid valves 36 and 38 may be closed, and the pump valve 46 is opened to allow removal of the mixed purge and processing fluids. The mixed fluids are pumped out of the system by a pump (not shown) through the pump valve 46. The purge fluids may or may not be introduced while the pumping process occurs, depending on the extent of the transient time or degree of cleanliness desired by the user. The Pump/purge cycles (wherein the purge valve 30 is closed for a time period while the pump continues to pump processing liquid and purging fluid form the system 10, followed by a time period wherein the purge valve 30 is opened so as to introduce more purging fluid to the system 10) may be performed to aid in sufficiently purging the processing liquid and particulates. A final flush of purging fluid may be performed to remove all residual processing liquid once the purging method using ultrasonic energy described above is completed.

While the foregoing is directed to the preferred embodiment of the present invention, other and further embodiments of the invention may be devised without departing from the basic scope thereof, and the scope thereof is determined by the claims that follow.

What is claimed is:

1. A liquid delivery system, comprising:
   (a) a processing liquid path connected to a semiconductor process chamber, wherein the processing liquid path comprises one or more liquid delivery components; and
   (b) an ultrasonic transducer mounted on the one or more liquid delivery components to enhance removal of processing liquids and contaminants from the liquid delivery system.

2. The liquid delivery system of claim 1, wherein the one or more liquid delivery components is selected from the group consisting of one or more liquid flow meters, one or more vaporizing elements, one or more isolation valves, one or more fluid lines, and combinations thereof.

3. The liquid delivery system of claim 2, wherein the ultrasonic transducer is mounted on the one or more liquid flow meters.

4. The liquid delivery system of claim 2, wherein the ultrasonic transducer is mounted on the one or more vaporizing elements.

5. The liquid delivery system of claim 4, wherein the one or more vaporizing elements comprise an injection valve.

6. The liquid delivery system of claim 1, wherein one or more of the one or more liquid delivery components comprises one or more housings.

7. The liquid delivery system of claim 6, wherein the ultrasonic transducer is mounted on the one or more housings.

8. The liquid delivery system of claim 2, wherein the ultrasonic transducer is mounted on the one or more isolation valves.

9. The liquid delivery system of claim 1, wherein the on e or more liquid delivery components comprise a gas box, the gas box comprising a liquid source assembly, a fluid purge assembly, and an isolation valve assembly.

10. The liquid delivery system of claim 9, wherein the ultrasonic transducer is mounted on the gas box.

11. The liquid delivery system of claim 2, wherein the ultrasonic transducer is mounted on the one or more fluid lines.

12. The liquid delivery system of claim 1, wherein the ultrasonic transducer comprises one or more ultrasonic transducer stacks.

13. The liquid delivery system of claim 12, wherein each of the one or more ultrasonic transducer stacks has a frequency of about 25 kHz to about 200 kHz.

14. The liquid delivery system of claim 1, wherein the ultrasonic transducer is secured to the one or more liquid delivery components by at least one fastener, an adhesive, welding, or combinations thereof.

15. The liquid delivery system of claim 1, further comprising a heater in thermal communication with the processing liquid path.

16. A liquid delivery system, comprising:
(a) a gas box coupled to a semiconductor process chamber;
(b) a liquid introduction enclosure coupled to the gas box;
(c) a pump valve assembly operatively coupled to the liquid introduction enclosure; and
(d) at least one ultrasonic transducer mounted on the gas box, the liquid introduction enclosure, the pump valve assembly, or a combination thereof to enhance removal of processing liquids and contaminants from the liquid delivery system.

17. The liquid delivery system of claim 16, further comprising one or more fluid lines coupled to the gas box, the liquid introduction enclosure, the pump valve assembly or a combination thereof.

18. The liquid delivery system of claim 17, wherein the at least one ultrasonic transducer is mounted on the at least one of the one or more fluid lines.

19. The liquid delivery system of claim 16, wherein the gas box comprises a liquid source assembly, a fluid purge assembly, and an isolation valve assembly, and the at least one ultrasonic transducer is mounted on the liquid source assembly, the fluid purge assembly, or the isolation valve assembly.

20. The liquid delivery system of claim 16, wherein the liquid introduction enclosure comprises an injection valve, a liquid flow meter, and at least one isolation valve, and the at least one ultrasonic transducer is mounted on the liquid flow meter, the injection valve, or the at least one isolation valve, or a combination thereof.

21. The liquid delivery system of claim 16, wherein the at least one ultrasonic transducer is mounted on the pump valve assembly.

22. The liquid delivery system of claim 16, wherein the at least one ultrasonic transducer comprises one or more ultrasonic transducer stacks.

23. The liquid delivery system of claim 22, wherein each of the one or more ultrasonic transducer stacks has a frequency of about 25 kHz to about 200 kHz.

24. The liquid delivery system of claim 16, wherein the at least one ultrasonic transducer is secured by at least one fastener, an adhesive, welding, or combinations thereof.

25. The liquid delivery system of claim 16, further comprising a heater in thermal communication with the processing liquid path.

26. A method of purging a processing liquid, comprising:
(a) introducing a purging fluid into a liquid delivery system connected to a semiconductor process chamber;
(b) launching ultrasonic energy to the purging fluid within the liquid delivery system to enhance removal of processing liquids and contaminants from the liquid delivery system; and
(c) pumping the processing liquid and the purging fluid from the liquid delivery system.

27. The method of claim 26, further comprising repeating (a), (b), and (c) until the liquid delivery system is substantially purged of the processing liquid.

28. The method of claim 26, further comprising:
(d) flushing the liquid delivery system with the purging fluid.

29. The method of claim 26, wherein the purging fluid is selected from a group consisting of a liquid, a gas, and combinations thereof.

30. The method of claim 29, wherein the purging fluid is a liquid solvent.

31. The method of claim 29, wherein the purging fluid is a non-reactive gas.

32. The method of claim 26, wherein the ultrasonic energy has a frequency of about 25 kHz to about 200 kHz.

33. The method of claim 26, wherein the ultrasonic energy has simultaneous multiple frequencies.

34. The method of claim 26, further comprising heating the liquid delivery system to increase removal of the processing liquid from the liquid delivery system.

35. The method of claim 26, wherein the liquid delivery system is heated to a temperature between about 70° C. and about 800° C.

36. A liquid delivery system for electronic device fabrication, comprising:
(a) a process path connected to a semiconductor process chamber; and
(b) one or more ultrasonic transducers disposed on the processing path to enhance removal of processing liquids and contaminants from the liquid delivery system.

37. The liquid delivery system of claim 36, wherein the one or more transducers launch an ultrasonic energy at about 25 kHz to about 200 kHz.

38. The liquid delivery system of claim 36, wherein the one or more transducers launch an ultrasonic energy at a frequency of greater than about 40 kHz.

39. The liquid delivery system of claim 36, wherein the one or more transducers have a power of about 10 watts to about 250 watts.

40. The liquid delivery system of claim 36, wherein the one or more transducers launch an ultrasonic energy from about 3 to about 60 seconds.

41. The liquid delivery system of claim 36, wherein the one or more transducers are activated sequentially or simultaneously.

42. The method of claim 36, wherein the one or more transducers have simultaneous multiple frequencies.

43. The liquid delivery system of claim 36, further comprising a heater in thermal communication with the processing path.

44. The method of claim 43, wherein the liquid delivery system is heated to a temperature between about 70° C. and about 800° C.

45. A liquid delivery system for electronic device fabrication, comprising:
(a) a processing path connected to a semiconductor process chamber; and
(b) one or more ultrasonic transducers disposed on the processing path to enhance a purge of processing liquids from the liquid delivery system.

46. The delivery system of claim 45, wherein the ultrasonic transducers enhance removal of the processing liquids and contaminants from the liquid delivery system.

47. The delivery system of claim 45, wherein the liquid delivery system comprises one or more liquid flow meters, vaporizing elements, isolation valves, fluid lines, gas boxes, heaters, or combinations thereof.

48. The delivery system of claim 45, wherein the one or more transducers launch an ultrasonic energy at about 25 kHz to about 200 kHz and have a power of about 10 watts to about 250 watts.

49. The delivery system of claim 45, wherein the one or more transducers launch an ultrasonic energy from about 3 to about 60 seconds.

50. The delivery system of claim 45, wherein the one or more transducers are activated sequentially or simultaneously.

51. A method of purging a processing liquid, comprising:
(a) introducing a purging fluid into a liquid delivery system connected to a semiconductor process chamber; and
(b) launching ultrasonic energy to the purging fluid to enhance removal of processing liquids and contaminants from the liquid delivery system, wherein the ultrasonic energy is launched at about 25 kHz to about 200 kHz and has a power of about 10 watts to about 250 watts.

52. The method of claim 51, further comprising:
(c) pumping the processing liquid and the purging fluid from the liquid delivery system.

53. The method of claim 52, further comprising:
(d) flushing the liquid delivery system with the purging fluid.

54. The method of claim 53, further comprising repeating (a), (b), (c), and (d) until the liquid delivery system is substantially purged of the processing liquid.

55. The method of claim 51, wherein the liquid delivery system comprises one or more liquid flow meters, vaporizing elements, isolation valves, fluid lines, gas boxes, heaters, or combinations thereof.

* * * * *